United States Patent [19]
Lyu

[11] Patent Number: 6,160,598
[45] Date of Patent: Dec. 12, 2000

[54] LIQUID CRYSTAL DISPLAY AND A METHOD FOR FABRICATING THEREOF

[75] Inventor: Ki Hyun Lyu, Kyungki-do, Rep. of Korea

[73] Assignee: LG Electronics Inc., Seoul, Rep. of Korea

[21] Appl. No.: 08/855,358

[22] Filed: May 13, 1997

[30] Foreign Application Priority Data

Aug. 26, 1996 [KR] Rep. of Korea ...................... 96-35533

[51] Int. Cl.[7] .......................... G02F 1/136; H01L 27/12; H01L 29/784
[52] U.S. Cl. ............... 349/111; 349/43; 349/187
[58] Field of Search ................. 349/42, 43, 110, 349/111, 187; 257/59, 72; 438/30; 204/181.2; 205/324

[56] References Cited

U.S. PATENT DOCUMENTS 5,352,907 10/1994 Matsuda et al. ..................... 257/59
5,409,851 4/1995 Oh ............................................ 438/30

FOREIGN PATENT DOCUMENTS 5-203990 8/1993 Japan .

*Primary Examiner*—William L. Sikes
*Assistant Examiner*—Tai V. Duong
*Attorney, Agent, or Firm*—Finnegan, Henderson, Farabow, Henderson, Garrett & Dunner, L.L.P.

[57] ABSTRACT

A liquid crystal display device comprises a substrate, a transparent electrode on the substrate, an anodizing layer and a non-anodizing layer on the transparent electrode, and a thin film transistor over the non-anodizing layer. The anodizing layer is a transparent insulating layer and the non-anodizing layer is an opaque metal layer. These layer are formed by anodizing a metal layer, of which a portion is blocked by a photoresist.

28 Claims, 4 Drawing Sheets

LIQUID CRYSTAL DISPLAY AND A METHOD FOR FABRICATING THEREOF

BACKGROUND OF THE INVENTION

The present invention relates to a liquid crystal display device, and more particularly to the liquid crystal display device and a method for fabricating thereof, in which a light shielding layer and an insulating layer are formed by anodizing a portion of a metal layer to prevent damage to a gate insulating layer caused by the light shielding layer.

An active matrix liquid crystal display (AM LCD) has a thin film transistor(TFT) in each pixel. By operation of this TFT, the LCD is driven. The AM LCD is a transparent type LCD in which light generated from a back light mounted on its rear part passes through the pixel region. Since the picture is provided only in the area that the pixel electrode is formed, the light passing through regions of the TFT, gate bus lines, and data bus lines deteriorates the degree of the distinction in the AM LCD. Thus, it is needed to prevent the leakage of the light through the regions of the TFT, the gate bus line, and the data bus line.

FIG. 1 is a plan view showing one pixel of conventional LCD. In this figure, the gate bus line 1 and the data bus line 2 extend in the horizontal and vertical directions and define the pixel region. The pixel electrode 9 is formed in the pixel region and the TFT is formed at the intersection of the gate bus line 1 and the data bus line in the pixel region. A gate electrode 3 and source/drain electrodes 4 of the TFT are electrically connected to the gate bus line 1 and the pixel electrode 9, respectively. In the regions of the TFT, the gate bus line 1, and the data bus line 2, a light shielding layer 7 is formed to prevent the leakage of the light therethrough.

The light shielding layer 7 is formed on the TFT array substrate or the color filter layer substrate. In the LCD with the light shielding layer 7 formed on the color filter layer substrate, the incorrect attachment of the substrates causes the deterioration of the aperture ratio.

In the LCD with the light shielding layer 7 formed on the TFT array substrate, as shown in FIG. 2, the formation of the TFT, the gate bus line 1, and the data bus line 2 directly on the light shielding layer 7 improves the aperture ratio. That is, the light shielding layer 7, which is a metal layer such as Cr layer and CrOx layer, is formed by the sputtering and photoetching process on a substrate 10 and an insulating layer 15 including SiOx and SiNx is formed by plasma chemical vapor deposition (plasma CVD) process thereon. The gate electrode 3 is formed on the insulating layer 15 and a gate insulating layer 16 is formed thereon. A semiconductor layer 5 and the source/drain electrodes 4 are sequentially formed on the gate insulating layer 16. A passivation layer 18, having a contact hole, is formed over the semiconductor layer 5 and the gate insulating layer 16, so that the source/drain electrodes 4 are electrically connected to the pixel electrode 9.

In the LCD shown in FIG. 2, since the light shielding layer 7 is correctly formed under the TFT, the gate bus line 1, and the data bus line 2, it does not cover the pixel region. Therefore, the aperture ratio is improved. However, since the gate insulating layer 16 is damaged by the step caused by the light shielding layer 7, the pixel electrode and the gate electrode are short-circuited.

SUMMARY OF THE INVENTION

It is an object of the present invention to provide a liquid crystal display device and a method for fabricating thereof in which an anodizing transparent layer and a non-anodizing opaque layer are used respectively as an insulating layer and a light shielding layer to prevent the generation of the step of the gate insulating layer.

In order to achieve this object, the present liquid crystal display device comprises a substrate, a transparent electrode on the substrate, an anodizing layer and a non-anodizing layer on the transparent electrode, a thin film transistor over the non-anodizing layer, and a pixel electrode in the pixel region. The anodizing layer and the non-anodizing layer are formed by anodizing a portion of a metal layer, such as Al, Ta, or Al alloy. The transparent electrode is formed by depositing an indium tin oxide.

In another aspect, the method for fabricating the liquid crystal display device comprises the steps of forming a transparent electrode on the substrate, forming a metal layer on the transparent electrode, anodizing a portion of the metal layer using a photoresist as a mask to form an anodizing layer and a non-anodizing layer, forming the insulating layer on the anodizing layer and the non-anodizing layer, forming a thin film transistor over the non-anodizing layer, and forming the pixel electrode in the pixel region.

To anodize the metal layer, the substrate on which the metal layer is formed is dipped into an electrolyte and a voltage is applied to the transparent electrode and the counter electrode from a power supply. At this time, since a portion of the metal layer is blocked by the photoresist, the anodizing layer and the non-anodizing layer of desired size can be obtained.

DETAILED DESCRIPTION OF THE INVENTION

Figure 1:
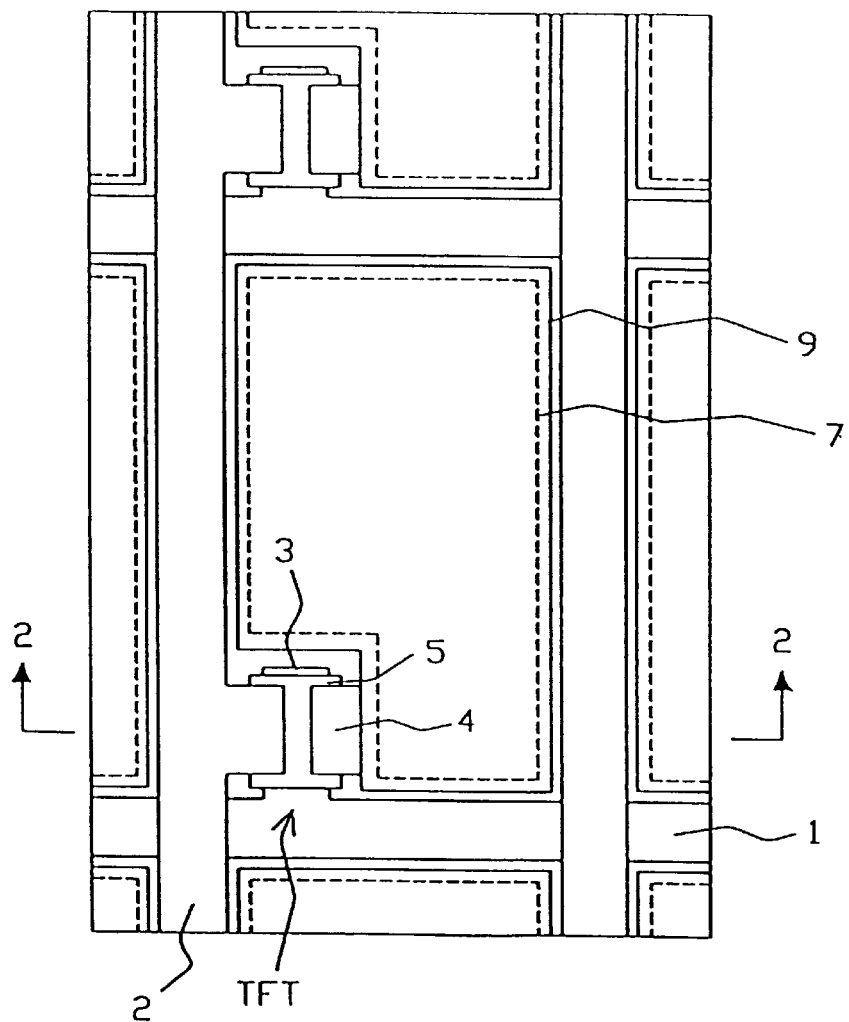
FIG. 1 is a plan view of the conventional liquid crystal display device.
Figure 2:
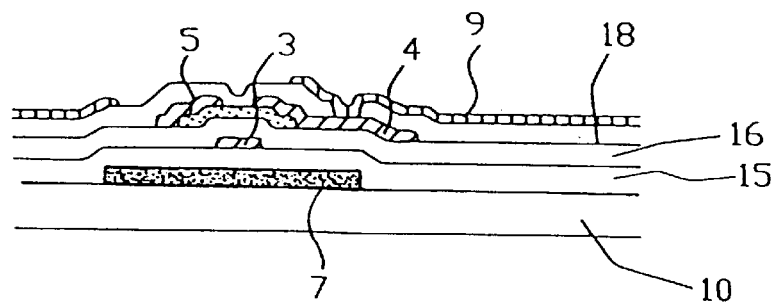
FIG. 2 is a sectional, view taken on line A–A" of FIG. 1.
Figure 3:
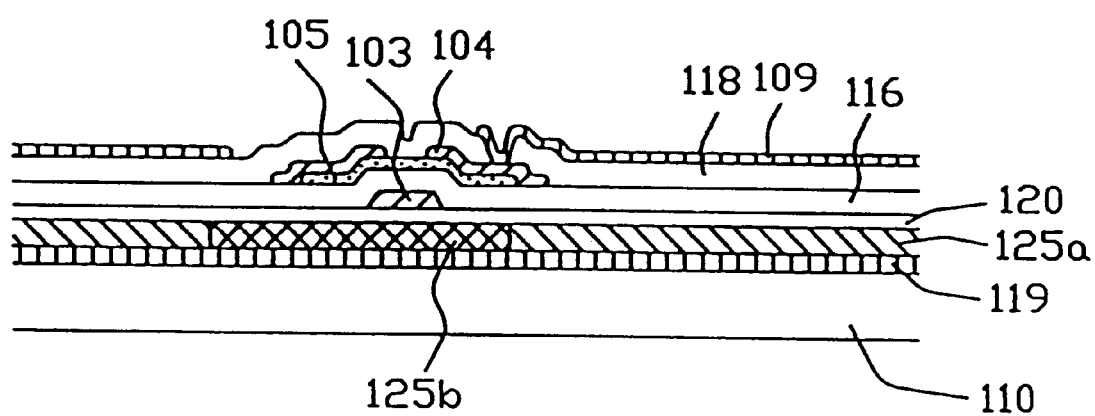
FIG. 3 is a sectional view of the liquid crystal display device according to the present invention.

Referring to FIG. 3, a transparent electrode 119 consisting of an indium tin oxide (ITO) is formed on a substrate 110, an anodizing layer 125a and a non-anodizing layer 125b are formed thereon. The anodizing layer 125a and the non-anodizing layer 125b, having same thickness, are the transparent insulating layer and the opaque metal layer, respectively. The opaque non-anodizing layer 125b blocks the light passing the regions of the data bus line, the gate bus line, and the TFT. In other words, the non-anodizing layer 125b serves as a shielding layer.

An insulating layer 120 of SiNx or SiOx covers the anodizing layer 125a and the non-anodizing layer 125b, a gate electrode 103, such as Al, Mo, Ta, and Al alloy, is formed thereon. Although not shown in the figure, the anodizing layer is formed in the gate electrode to prevent the hillock of the gate electrode. A gate insulating layer 116 such as SiNx layer and SiOx layer covers the gate electrode 103 and the insulating layer 120. A semiconductor layer 105, such as amorphous silicon(a-Si) layer, is formed in the region of the non-anodizing layer 125b thereon. Source/drain electrodes 104, composed of a metal, are formed on both side of the semiconductor layer 105. A passivation layer 118 having a contact hole is formed over the semiconductor layer 105 and the gate insulating layer 116. One of the source/drain electrodes 104 is electrically connected to a pixel electrode 109 formed in the pixel region through the contact hole. The pixel electrode 109 includes the ITO.

In the above mentioned LCD device, since the non-anodizing layer 125b serving as the light shielding layer and the anodizing layer 125a are a continuous layer with the same thickness, the step of the gate insulating layer 116 caused by the light shielding layer 125b is not generated.

Figure 4A:
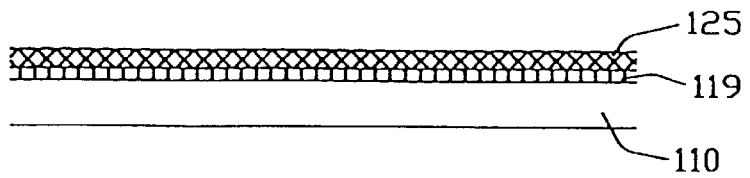
FIGS. 4a to 4e are views showing the fabrication method of the liquid crystal display device according to present invention.

The method for fabricating the LCD device will be described below with reference to FIGS. 4a–4e. On the substrate 110, as shown in FIG. 4a, the ITO and the Al, Ta, or Al alloy are continuously deposited by the sputtering process to form the transparent electrode 119 and the metal layer 125. Subsequently, a photoresist 130 is deposited and patterned on the metal layer 125 to block a portion of the metal layer 125 as a mask, and then the metal layer 125 is anodized. By the anodization, the metal layer 125, except for the portion blocked by the photoresist 130, is converted into the transparent insulating layer.

Figure 5:
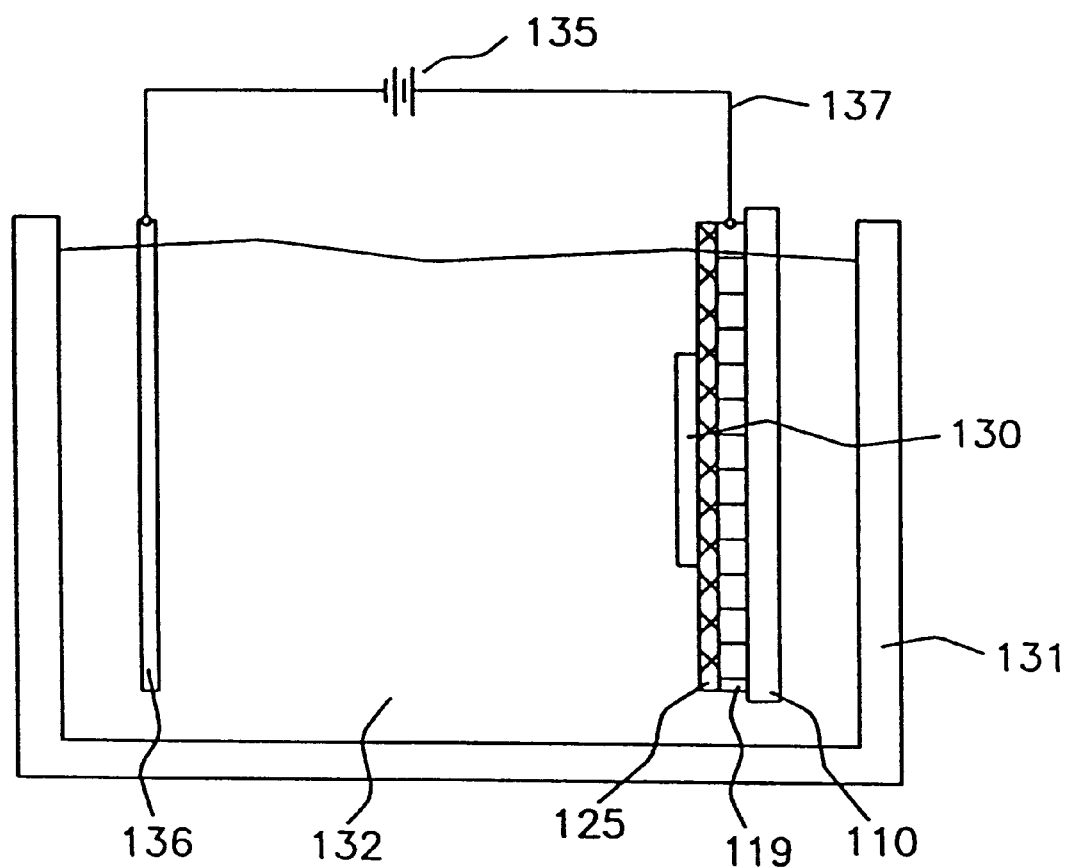
FIG. 5 is a view showing the anodizing process according to the present invention.

FIG. 5 is a view showing anodizing process of the metal layer 125. As shown in the figure, the substrate 110 is arranged in one side of a case 131 filled with an electrolyte 132. The transparent electrode 119 and the metal layer 125 are formed on the substrate 110, the photoresist 130 is deposited on the metal layer 125 in a prescribed width. A counter electrode 136 including metal is arranged on the other side of the case 131, so that the substrate 110 and the counter electrode 136 are facing each other. Furthermore, the transparent electrode 119 and the counter electrode 136 are connected to the anode and the cathode terminals of a power supply 135 through a connecting line 137. The power supply 135 supplies sufficient power to the transparent electrode 119 and the counter electrode 136, so that the metal layer 125, except for portion blocked by the photoresist 130, is perfectly anodized.

In a conventional anodizing process, the power supply is directly connected to the metal layer on the substrate, so that the metal layer is anodized from up to down in order with the lapse of time. With the conventional anodizing process, however, the metal layer is anodized locally, not uniformly over the total area. Thus, an area of the metal layer is not anodized. In addition, if the thickness of the metal layer is not uniform, the current is cut off during the anodizing process by the anodized area so that the area under the anodized area is not anodized. This non-anodized opaque area causes the deterioration of the picture quality.

In the present process, however, the transparent electrode 119 is formed between the substrate 110 and the metal layer 125 and the power supply 135 is connected to the transparent electrode 119 and the counter electrode 136. Without the cut off of the current, the metal layer 125 on the transparent electrode 119 is perfectly anodized except for the area blocked by the photoresist 130.

Figure 4B:
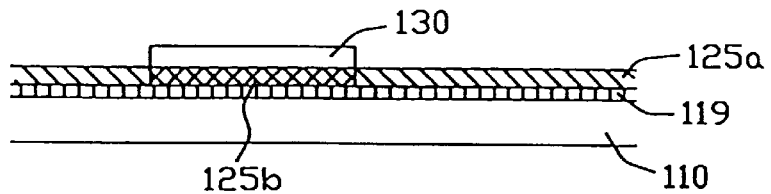
Figure 4C:
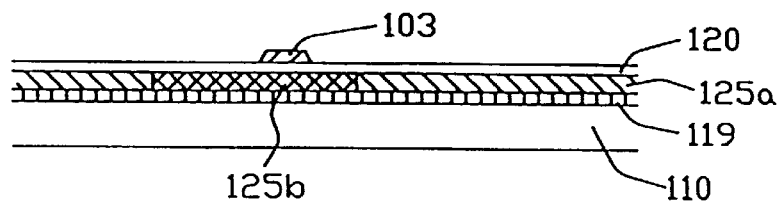

By the anodization, the anodizing layer 125a and the non-anodizing layer are formed in the metal layer 125, as shown in FIG. 4b. Since the anodizing layer 125a is a transparent insulating layer and the non-anodizing layer 125b is an opaque metal layer, the non-anodizing layer 125b is used as the light shielding layer.

Figure 4D:
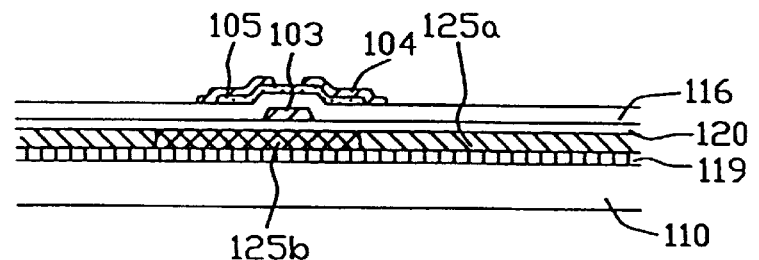

After elimination of the photoresist 130, the insulating layer 120, such as a SiNx layer or SiOx layer, is deposited on the anodizing layer 125a and the non-anodizing layer 125b by the plasma CVD process. Thereafter, the gate electrode 103 is formed over the non-anodizing layer 125b by depositing and patterning a metal, such as Al, Mo, Cr, or Al alloy. The anodizing layer, not shown in figure, is formed on the gate electrode 103 to prevent the hillock of the gate electrode 103. Over the gate insulating layer 120, as shown in FIG. 4d, the SiNx or SiOx and a-Si are continuously deposited by the plasma CVD process, and then the a-Si is etched to form the gate insulating layer 116 and the semiconductor layer 105. On both side of the semiconductor layer 105, the source/drain electrodes 104 of Al, Mo, Cr, or Al alloy are formed by the sputtering and photoetching processes.

Although not shown in figures, the n+ ions are doped into the semiconductor layer 105 or n+ a-Si is directly deposited on the semiconductor layer 105 to form the n+ ohmic contact layer between the source/drain electrodes 104 and the semiconductor layer 105.

Figure 4E:
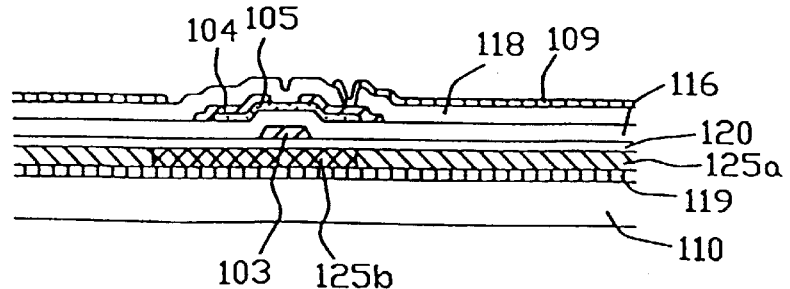

Thereafter, the passivation layer 118 including SiNx or SiOx is formed over the semiconductor layer 105 and the gate insulating layer 116 by the plasma CVD process and etched to form the contact hole, as shown in FIG. 4e. The pixel electrode 109 is formed in the pixel region on the passivation layer 118, so that the pixel electrode and one of the source/drain electrodes 104 are electrically interconnected through the contact hole.

In the above mentioned LCD device, since the anodizing layer and the non-anodizing layer, which are the insulating layer and the light shielding layer, respectively, are formed in a continuous layer with the same thickness, the step of the light shielding layer is not generated. Therefore, the gate insulating layer is not damaged, the pixel electrode and the gate electrode are not short circuited, and the yield is improved.

While the, preferred form of the present invention has been described, it is to be understood that modifications will be apparent to those skilled in the art without departing from the spirit of the invention.

The scope of the invention, therefore, is to be determined solely by the following claims.

What is claimed is:

1. A liquid crystal display device, comprising:

a substrate;

a transparent electrode on the substrate; and an anodizing layer and a non-anodizing layer on the transparent electrode, the anodizing layer and the non-anodizing layer being a transparent insulating layer and an opaque metal layer, respectively, the non-anodizing layer being a shielding layer.

2. A liquid crystal display device according to claim 1, further comprising:

an insulating layer on the anodizing layer and the non-anodizing layer;

a thin film transistor over the non-anodizing layer;

a passivation layer on the thin film transistor and the insulating layer; and a pixel electrode in a pixel region on the passivation layer.

3. A liquid crystal display device according to claim 2, wherein the transparent electrode includes indium tin oxide.

4. A liquid crystal display device according to claim 2, the thin film transistor includes:

a gate electrode over the non-anodizing layer;

a gate insulating layer on the gate electrode;

a semiconductor layer over the non-anodizing layer; and source/drain electrodes on both sides of the semiconductor layer.

5. A liquid crystal display device according to claim 4, further comprising an anodizing layer on the gate electrode to prevent hillock of the gate electrode.

6. A liquid crystal display device according to claim 2, wherein the pixel electrode includes indium tin oxide.

7. A liquid crystal display device according to claim 2, further comprising a contact hole formed in the passivation layer to interconnect electrically the pixel electrode and one of the source/drain electrodes.

8. A liquid crystal display device according to claim 2, wherein the non-anodizing layer is selected from the group consisting of Al, Ta, and Al alloy.

9. A liquid crystal display device, comprising:

a substrate;

a transparent electrode on the substrate; and an anodizing layer and a non-anodizing layer having a uniform thickness in a continuous layer on the transparent electrode, the anodizing layer and the non-anodizing layer being a transparent insulating layer and an opaque metal layer, respectively, the non-anodizing layer being a shielding layer.

10. A liquid crystal display device according to claim 9, further comprising:

an insulating layer on the anodizing layer and the non-anodizing layer;

a gate electrode over the non-anodizing layer;

a gate insulating layer on the gate electrode and the insulating layer;

a semiconductor layer over the non-anodizing layer;

source/drain electrodes on both sides of the semiconductor layer;

a passivation over the semiconductor layer and the gate insulating layer; and a pixel electrode in the pixel region on the passivation layer.

11. A liquid crystal display device according to claim 10, further comprising an anodizing layer on the gate electrode to prevent hillock of the gate electrode.

12. A liquid crystal display device according to claim 10, wherein the transparent electrode includes indium tin oxide.

13. A liquid crystal display device according to claim 10, wherein the pixel electrode includes indium tin oxide.

14. A liquid crystal display device according to claim 10, further comprising a contact hole formed in the passivation layer to interconnect electrically the pixel electrode and one of the source/drain electrodes.

15. A liquid crystal display device according to claim 10, wherein the non-anodizing layer is selected from the group consisting of Al, Ta, and Al alloy.

16. A method for fabricating a liquid crystal display device, comprising the steps of:

forming a transparent electrode on a substrate;

forming an anodizing layer and a non-anodizing layer on the transparent electrode;

forming an insulating layer on the anodizing layer and the non-anodizing layer;

forming a thin film transistor over the non-anodizing layer;

forming a passivation layer over the thin film transistor and the insulating layer; and forming a pixel electrode in a pixel region on the passivation layer.

17. A method for fabricating a liquid crystal display device according to claim 11, wherein the transparent electrode includes indium tin oxide.

18. A method for fabricating a liquid crystal display device according to claim 16, wherein the step of forming the anodizing layer and the non-anodizing layer includes the steps of:

forming a metal layer on the transparent electrode;

depositing selectively a photoresist on the metal layer to block a portion of the metal layer; and anodizing the metal layer within an electrolyte.

19. A method for fabricating a liquid crystal display device according to claim 18, wherein the metal layer is selected from the group consisting of Al, Ta, and Al alloy.

20. A method for fabricating a liquid crystal display device according to claim 16, wherein the pixel electrode includes indium tin oxide.

21. A method for fabricating a liquid crystal display device according to claim 16, wherein the step of forming the thin film transistor includes the steps of:

forming a gate electrode over the non-anodizing layer;

forming a gate insulating layer on the gate electrode and the insulating layer;

forming a semiconductor layer over the non-anodizing layer; and forming source/drain electrodes on the semiconductor layer.

22. A method for fabricating a liquid crystal display device according to claim 21, further comprising the step of anodizing the gate electrode to form an ohmic layer between the semiconductor layer and the source/drain electrodes.

23. A method for fabricating a liquid crystal display device comprising the steps of:

forming a transparent electrode on a substrate;

forming a metal layer on the transparent electrode;

anodizing a portion of the metal layer so as to form an anodizing layer and a non-anodizing layer;

forming an insulating layer on the metal layer;

forming a gate electrode over the non-anodizing layer;

forming a gate insulating layer on the gate electrode and the insulating layer;

forming a semiconductor layer over the non-anodizing layer;

forming source/drain electrodes on the semiconductor layer;

forming a passivation layer over the semiconductor layer and the gate insulating layer; and forming a pixel electrode in a pixel region on the passivation layer.

24. A method for fabricating a liquid crystal display device according to claim 23, wherein the step of anodizing a portion of the metal includes the step of selectively depositing photoresist on the metal layer to block a portion of the metal layer during the anodizing process.

25. A method for fabricating a liquid crystal display device according to claim 23, further comprising the step of anodizing the gate electrode to prevent hillock of the gate electrode.

26. A method for fabricating a liquid crystal display device according to claim 23, wherein the transparent electrode includes indium tin oxide.

27. A method for fabricating a liquid crystal display device according to claim 23, wherein the metal layer is selected from the group consisting of Al, Ta, and Al alloy.

28. A method for fabricating a liquid crystal display device according to claim 23, wherein the pixel electrode includes indium tin oxide.

* * * * *

UNITED STATES PATENT AND TRADEMARK OFFICE
CERTIFICATE OF CORRECTION

PATENT NO.    : 6,160,598
DATED         : December 12, 2000
INVENTOR(S)   : Ki Hyun Lyu It is certified that error appears in the above-identified patent and that said Letters Patent is hereby corrected as shown below:

<u>Title page,</u>
Line 2, in the "Attorney, Agent, or Firm", before "Garrett", delete "Henderson,".
Item [57], ABSTRACT,
Line 6, "These layer" should read -- These layers --.

<u>Column 5, claim 17,</u>
Line 58, "claim 11" should read -- claim 16 --.

Signed and Sealed this

First Day of January, 2002

Attest:

JAMES E. ROGAN
Attesting Officer    *Director of the United States Patent and Trademark Office*